United States Patent [19]
Frijlink et al.

[11] Patent Number: 5,654,214
[45] Date of Patent: Aug. 5, 1997

[54] METHOD OF MANUFACTURING A SEMICONDUCTOR DEVICE HAVING AT LEAST TWO FIELD EFFECT TRANSISTORS WITH DIFFERENT PINCH-OFF VOLTAGES

[75] Inventors: Peter M. Frijlink, Crosne; Joseph Bellaiche, Vincennes, both of France

[73] Assignee: U.S. Philips Corporation, New York, N.Y.

[21] Appl. No.: 494,531

[22] Filed: Jun. 28, 1995

[30] Foreign Application Priority Data

Jun. 29, 1994 [FR] France .................. 94 08012

[51] Int. Cl.$^6$ ........................... H01L 21/8252
[52] U.S. Cl. ................ 438/172; 438/174; 438/571; 438/576; 438/704; 438/695
[58] Field of Search ................ 437/40–41, 912; 257/194, 284

[56] References Cited

U.S. PATENT DOCUMENTS

| | | | |
|---|---|---|---|
| 5,023,675 | 6/1991 | Ishikawa | 357/22 |
| 5,508,535 | 4/1996 | Nakanishi | 257/192 |
| 5,514,605 | 5/1996 | Asai et al. | 437/40 |
| 5,534,452 | 7/1996 | Nakanishi et al. | 437/40 |
| 5,556,797 | 9/1996 | Chi et al. | 437/40 |

FOREIGN PATENT DOCUMENTS

| | | | |
|---|---|---|---|
| 55-53460A | 4/1980 | Japan | 437/40 |
| 59-220927 | 12/1984 | Japan . | |
| 05055268 | 3/1993 | Japan . | |

*Primary Examiner*—John Niebling
*Assistant Examiner*—Richard A. Booth
*Attorney, Agent, or Firm*—Steven R. Biren

[57] ABSTRACT

A method of manufacturing a semiconductor device comprising a buried channel field effect transistor, which method comprises the formation of a stack of layers on a substrate (1) with an active semiconductor layer (13, 14) having a non-zero aluminium (Al) content, a semiconductor cap layer (4) without aluminium (Al), a masking layer (100) provided with a gate opening (51); a first selective etching step by means of a fluorine (F) compound in the cap layer (4) down to the upper surface (22) of the active layer (13, 14) on which a stopper layer (3) of aluminum fluoride (AlF$_3$) is automatically formed; removal of said stopper layer (3) and covering of the region of the first transistor (T) with a material (200) which can be removed without deterioration of the masking layer (100); a second, non-selective etching step in the active layer (13, 14) down to a depth (62E) equal to the difference (HE–HD) in depth between the gate recesses (52D, 52E) of the two transistors; removal of the covering material (200); and a third, non-selective etching step in the active layer (13, 14) simultaneously for the two transistors (D, E) down to the bottom level (42D) of the gate recess of the first transistor (D).

13 Claims, 4 Drawing Sheets

METHOD OF MANUFACTURING A SEMICONDUCTOR DEVICE HAVING AT LEAST TWO FIELD EFFECT TRANSISTORS WITH DIFFERENT PINCH-OFF VOLTAGES

BACKGROUND OF THE INVENTION

The invention relates to a method of manufacturing an integrated semiconductor device on a substrate, comprising steps for forming at least two field effect transistors, both of the buried-channel type, with different pinch-off voltages.

Among the field effect transistors having different pinch-off voltages there are the enhancement-type transistor and the depletion-type transistor.

An enhancement-type transistor is understood to be a transistor which is blocked when there is no gate-source voltage (also called normally-OFF or N-OFF).

A depletion-type transistor is understood to be a transistor which is conducting when there is no gate-source voltage (also called normally-ON or N-ON).

The enhancement-type transistor has a pinch-off voltage which is more positive than that of the depletion-type transistor.

For simplicity's sake, the depletion-type transistor will be designated with D and the enhancement-type transistor with E hereinafter. These transistors are of different structure, i.e. the thickness of the active layer on which the gate contact is realised is different for each of them. This thickness is smaller for the enhancement-type transistor than for the depletion-type transistor.

In this manufacturing process, the invention relates exclusively to the case of semiconductor devices comprising transistors which have buried channels for realising the two types D and E. In that case, the active layer which supports the gate contact is buried below this gate contact, the gate contact thus being disposed in the recess so as to control more exactly the thickness of the active layer which governs the operation of the transistor.

The invention applies in particular to the realisation of integrated semiconductor devices including high electron mobility transistors (HEMT) of which the two types D and E are present on one and the same semiconductor substrate and are to be manufactured in the course of the same process.

The invention finds its application, for example, in the manufacture of semiconductor devices including an integrated circuit in which an amplifier stage comprises a type E transistor in the inverting mode with a type D transistor as the current source.

The invention finds its application in particular in the realisation of large scale integrated devices (LSI) or very large scale integrated devices (VLSI).

A manufacturing process for a semiconductor device, comprising steps for manufacturing two types of high electron mobility transistors on one and the same substrate is known from prior-art U.S. Pat. No. 5,023,675 of 11 Jun. 1991 (Tomoroni Ishikawa-FUJITSU Limited). This document describes a process for realising two types of transistors, the enhancement and depletion type, on one substrate. According to this known process, first a structure of active layers of semiconductor materials is realised. With reference to FIGS. 5 and 6 of the cited document, this stack comprises on a substrate 21 of semi-insulating InP a first layer 22 of InGaAs and a second layer 23 of InAlAs, constituting a heterojunction for the formation of a bidimensional electron gas at the interface. On this stack of active layers, a cap layer 24 is present, formed by three sub-layers: a lower layer 24a of n-type doped GaAsSb, an intermediate layer 24b of n-type doped InAlAs, and an upper layer 24c of n-type doped GaAsSb.

The intermediate layer 24b is provided as an etching stopper layer within the cap layer 24. Its thickness will be of the order of 2 to 3 nm.

This process further comprises steps for realising the two types of transistors, enhancement and depletion, each having a buried channel. To achieve the difference between these two types, the depth of the buried channel is different for each, from which it follows that the active layer arranged between the bottom of the buried channel where the Schottky gate contact will be and the interface where the bidimensional gas will be formed has a different depth, thus facilitating the operation in the depletion mode or in the enhancement mode, as applicable, of each of these transistors.

These steps comprise first the deposition of a dielectric layer 25 ($SiO_2$) with openings for realising ohmic source and drain contacts. This dielectric layer 25 is retained throughout the process.

Subsequently, a photoresist layer 27 is deposited as a mask in which the gate opening 27a of the enhancement-type transistor is formed.

The process then continues with etching steps for starting the manufacture of the enhancement-type transistor:
- a first etching step of the dielectric layer 25 through the gate opening 27a,
- a second etching step of the cap layer 24c down to the stopper layer 24b through selective RIE of the layer 24c without In (indium) through the gate opening 27a. This selective RIE stops at the layer 24b because the latter contains In (indium). The ratio between the RIE rate in the cap layer 24c without In and the RIE rate in the stopper layer 24b with In is 50, when a mixture of $CCl_2F_2$ and He (helium) is used,
- a third selective etching step in the stopper layer 24b of InAlAs by wet etching in $H_2SO_4$, $H_2O_2$, $H_2O$.

The process is now temporarily stopped when the upper surface of the lower cap layer 24a is exposed as far as the realisation of the enhancement-type transistor is concerned; now the steps for realising the depletion-type transistor are started, comprising:
- formation of the gate opening 27b in the photoresist masking layer,
- a second etching step of the dielectric layer 25 through the gate opening 27b,
- a second selective etching step of the cap layer 24c down to the stopper layer 24b through the gate opening 27b, which second etching step is similar to the second selective etching step already carried out for realising the enhancement-type transistor.

During this second selective etching step for the depletion-type transistor, the making of the enhancement-type transistor is resumed as follows:
- a selective etching step of the lower cap layer 24a through the gate opening 27a by the same selective RIE means as in the second manufacturing step of each of the two transistors: i.e. in this process the selective RIE of the upper cap layer 24c of the depletion-type transistor is carried out substantially simultaneously with the selective RIE of the lower cap layer 24a of the enhancement-type transistor.

The manufacture of the depletion-type transistor is continued with:

a third selective etching step of the stopper layer 24b of InAlAs similar to the third selective etching step of the enhancement-type transistor previously realised.

As a result, at the end of these selective etching steps:

the enhancement-type transistor has a buried channel whose etching was stopped the moment the upper surface of the active layer 23 was exposed, the depletion-type transistor has a buried channel whose etching was stopped the moment the upper surface of the lower cap layer 24a was exposed.

This known process has disadvantages and renders it impossible to solve certain problems.

First, it has the disadvantage that it comprises twice two selective etching steps, which means that the designer of integrated circuits is not free to choose the semiconductor materials and etching agents.

It is an object of the present invention to provide a simpler process.

Furthermore, it has the disadvantage that the transistors obtained by this method are not really of the buried-channel type because only the cap layer is etched to a greater or lesser extent in dependence on the type of transistor. This cap layer is not the active layer; it simply serves to improve the ohmic source and drain contacts and to space apart the active layer from mechanical and electrical disturbances caused by the formation of the ohmic contact alloy. One of the transistors retains a portion 24a of the cap layer in its structure. The other transistor has its Schottky gate contact deposited directly on the upper surface of the active layer 23. Accordingly, neither of the transistor types benefits from the performance improvements following from the buried channel technology, which technology permits of a much more exact adjustment of the pinch-off voltages of the transistors.

SUMMARY OF THE INVENTION

The problem arises how to achieve such an exact adjustment in the manufacture of transistors of recent design; these new transistors nowadays have so small dimensions, which implies very high doping levels of certain layers, that they consequently require much higher accuracies for all their dimensions than were necessary only a short time ago for slightly larger transistors.

The solution to this accuracy problem in the realisation of the transistor with a recess for accommodating the Schottky gate contact, which recess is etched more or less deeply into the active layer depending on the type of transistor, lies in an exact adjustment of the thickness of this active layer, and thus in an exact adjustment of the pinch-off voltage.

It is one of the objects of the present invention to provide a method of realising two types of transistors on the same support wafer, each having a buried channel but of different depths, in the active layer in an appropriate manner.

Furthermore, the known process has the disadvantage that a portion of the cap layer remains in the structure of the depletion-type transistor. This results in a decrease in the breakdown voltage, which is unfavourable for transistors of very small dimensions as mentioned above. In this case, moreover, the gate of the transistor is close to electrical defects.

It is an object of the present invention to provide a method of realising transistors whose breakdown voltage is improved compared with those of the cited document and whose cap layer actually performs its function of forming a spacer against defects.

In addition, the known process has the disadvantage that portions of the stopper layer 24b remain between the gate recesses of the two transistors. These layer portions, which are thin, approximately 2 to 3 nm, do not increase the access resistances because of the material InAlAs, but they do diminish the breakdown voltage.

It is another object of the present invention to provide a method of realising buried-channel transistors in whose structure no portions of stopper layers remain after completion, so that an increase in the access resistances is avoided, subject to the material of the stopper layers, as well as avoiding the creation of wells, involving a trapping effect, or the decrease in the breakdown voltage.

In general terms, it is an object of the invention to provide a method of realising on one support wafer simultaneously transistors of which one has a pinch-off voltage which is more positive, or less negative than the other, for example of the enhancement and depletion types, with a gate recess whose bottom is positioned with a very high precision relative to the bottom of this active layer, or any other set of transistors having different pinch-off voltages.

Another problem in the mass manufacture of semiconductor devices realised on support wafers lies in the useful manufacturing output. The useful manufacturing output is considered good if the performances of the transistors are uniform over the entire surface area of the semiconductor wafer, i.e. lie within a range of characteristics which was determined previously. In particular, these performances must be uniform from one edge of the wafer to the other (usually, over a diameter of 7.6 cm=3") and from one wafer to the next.

To illustrate the importance of the problem, still by way of example, a field effect transistor of the enhancement type may be taken, which has a buried channel over a depth of the order of 15 nm in the upper active layer, which itself is of the order of 50 nm. This transistor operates between 200 mV and 700 mV, with a pinch-off voltage of the order of 350 mV. Any error in the positioning of the bottom of the gate recess will create an error in the pinch-off voltage. For example, an error having the height of one monolayer of crystalline semiconductor material (a monolayer has a thickness of the order of 0.3 nm) in this depth leads to an error of 22 mV in the pinch-off voltage, because the final thickness of the channel layer is determined by the position of the bottom of the gate recess relative to the bottom of the active buried layer. The result of this is that, with an enhancement-type transistor which has such a narrow operational range, an error in the position of the bottom of the gate recess of a few crystal monolayers leads to a terrible variation in the electrical performance of this transistor.

Again by way of example, a field effect transistor of the depletion type itself has a buried channel over a depth of the order of 6 nm in the upper active layer, i.e. a difference of scarcely 10 nm with the recess of the enhancement-type transistor.

The result of this is that, again for the same reason, the positioning of the bottoms of the gate recesses must be very exact for either transistor type. Also in the case of manufacture of two different transistor types on the same wafer, the error in the position of the bottoms of the gate recesses must never exceed the height of a few crystal monolayers of the material of the channel layer, i.e. no more than a few times 0.3 nm. Generally, this error must be as small as possible in relation to the value of approximately 10 nm which is the difference between the characteristic distances of the two types of transistor to be realised.

It is another object of the invention, therefore, to provide a manufacturing method which renders it possible not only to realise the buried channel of each transistor type with a high accuracy, but also with a high degree of uniformity over the assembly of one and the same support wafer, and from one wafer to the next.

According to the invention, these objects are achieved by means of a method of manufacturing a semiconductor device comprising at least two field effect transistors of the buried channel type of which the first has a gate recess which is less deep than that of the other, which method comprises:

the realization of a stack of layers on a substrate, among which at least:

an active layer of a semiconductor compound having a non-zero aluminium content, in which a gate recess is to be provided, a cap layer of a semiconductor compound without aluminium, a masking layer provided with a gate opening for each transistor, a first selective etching step with a first etching compound comprising fluorine carried out in the cap layer through the gate openings of the two transistors until a stopper layer of aluminium fluoride is formed at the upper surface of the active layer, after which said stopper layer is eliminated, and the region of the first transistor is covered with a material which can be eliminated without deterioration of the masking layer previously deposited, a second non-selective etching step carried out in the active layer through the gate opening down to an intermediate level of the gate recess of the second transistor E, to a depth equal to the difference in depth between the gate recesses of the two transistors, followed by removal of the covering material, a third non-selective etching process carried out in the active layer simultaneously through the two gate openings of the two transistors down to the bottom level of the gate recess of the first transistor.

An advantage offered by the method according to the invention is that an etching stopper layer is formed, not during the realisation of the semiconductor layers before each etching step, but during one of the etching steps itself while this etching step is going on, and in that this stopper layer thus formed has remarkable properties:

it is formed automatically during said etching step in a reproducible position, which is the upper surface of the active layer, and indeed over the entire surface area of the substrate being treated, it stops automatically this ongoing etching step at this level, which serves as a reproducible reference over the entire surface of the substrate under treatment, it is formed to a thickness which is sufficient for stopping the ongoing etching step, it is formed to a thickness which is sufficiently small for being easily removed without prolonging the process or disturbing surfaces already formed, more particularly a thickness approximately 10 times smaller than the stopper layer present in the structure according to the present art.

Another advantage offered by the method according to the invention is that the etching stopper layer used is removed during the process. This advantage lies more particularly in the fact that this stopper layer no longer exists in the completed transistor, and that therefore the transistor thus formed does not have its performance interfered with by parasitic layers, in contrast to transistors which still contain stopper layers in the finished state: it is in fact evident that, in view of the submicron dimensions used in the transistors nowadays, any unnecessary element, of however small dimensions, will interfere with the operation; for example, it is known that certain stopper layers maintained at the end of the process introduce parasitic resistances, or form wells leading to trapping effects; it is also known that certain stopper layers whose composition is by contrast capable of reducing access resistances are not voltage-resistant and produce breakdowns, in particular in present-day submicron transistors.

Another advantage offered by the method according to the invention is that the bottom levels of the gate recesses are realised starting from a level which has been accurately defined by the stopper layer. Consequently, these levels, whose positions are very important for defining the thickness of the active layer, are now obtained by a well-controlled etching step, and are themselves well-defined. In fact, from the moment the stopper layer has been removed, the thickness of material to be etched away in each non-selective etching step is very small, and accordingly the error which may arise on such a small etching depth can only be extremely small. The required accuracy in the positions of the gate recess bottoms is thus obtained, which is of the greatest importance because it is known that the enhanced or depleted thicknesses which play a part in blocking or rendering conducting the transistors are very small, and that any inaccuracy in the final thickness of the channel will result in catastrophic variations in the performance of the finished transistors. The performance levels of the transistors according to the invention now are ensured to be very good, reliable, and reproducible in the course of the manufacturing process of several thousands of transistors distributed over a large surface.

BRIEF DESCRIPTION OF THE DRAWINGS

The invention will be described in detail below with reference to the annexed diagrammatic Figures, in which.

DESCRIPTION OF THE PREFERRED EMBODIMENTS

Figure 1A:
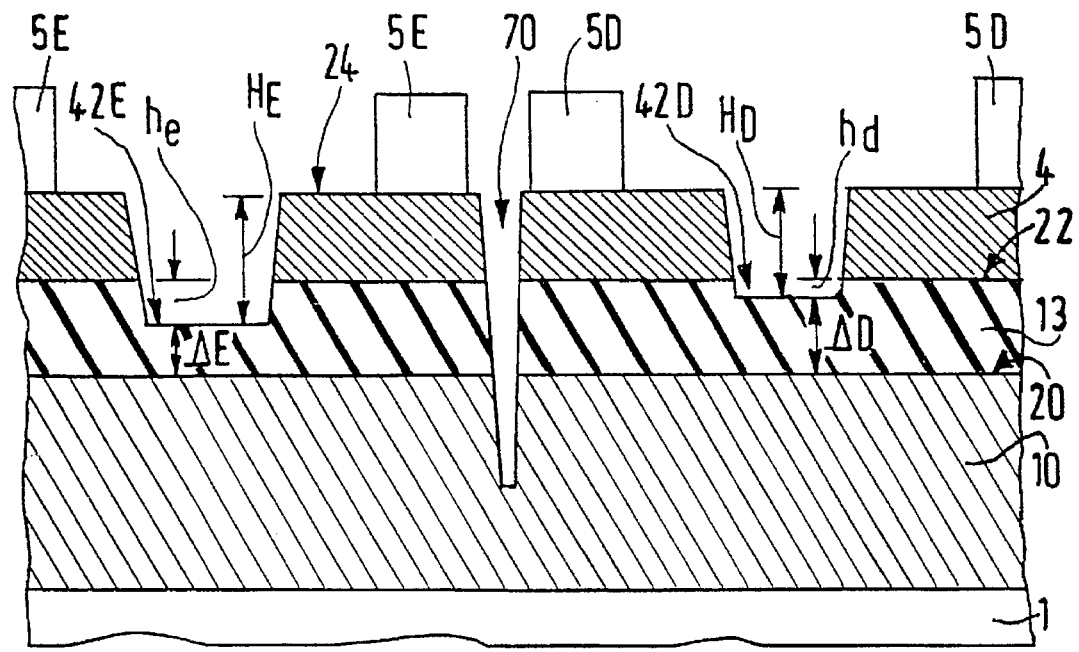
FIG. 1A is a cross-section through two field effect transistors of the buried-channel HEMT type, one of the depletion and the other of the enhancement type, where differences in depth between the gate recesses are necessary.

The invention relates to a method of manufacturing a semiconductor device comprising at least two buried-channel transistors on a substrate, one with reference E of a first type having a more positive, or less negative pinch-off voltage than the other, for example of the enhancement type, i.e. normally blocked in the absence of a gate-source voltage (normally-OFF transistor), the other with reference D, of a second type, i.e. having another pinch-off voltage, for example of the depletion type, i.e. normally conducting in the absence of a gate-source voltage (depletion, normally-ON transistor).

The invention is described in its application to the realisation of high electron mobility transistors, referred to hereinafter as HEMT.

The properties of the HEMT per se are well known to those skilled in the art of integrated circuits, whether digital or analog, in all technologies, and are not described any further hereinafter.

Generally, both the enhancement-type HEMT and the depletion-type HEMT comprise a stack of active layers on a substrate 1, among which at least:

a first layer 10 of a first material of small energy bandgap, weakly doped;

a second active layer 13 of a second material of greater energy bandgap strongly $n^{++}$ type doped, forming a heterostructure with the first layer 10, with an interface 20;

a third layer 4 or cap layer, strongly $n^{++}$ type doped.

Each depletion-type HEMT D and enhancement-type E comprises, respectively:

two ohmic contact pads for forming the electric source and drain contacts of the transistor; these pads are realised at the surface of the cap layer by means of a metal/semiconductor alloy; the ohmic contacts of the depletion-type transistor are referenced 5D; those of the enhancement-type transistor 5E;

a metal gate pad directly deposited on the material of the upper active layer 13 for forming a Schottky barrier; the Schottky contact of the depletion-type transistor is referenced 8D, that of the enhancement-type transistor 8E.

This Schottky barrier must lie at a very exact distance from the bottom of the active layer 13; i.e. at a very exact distance away from the interface 20 of the heterostructure formed by the layers 13, 10.

Figure 1B:
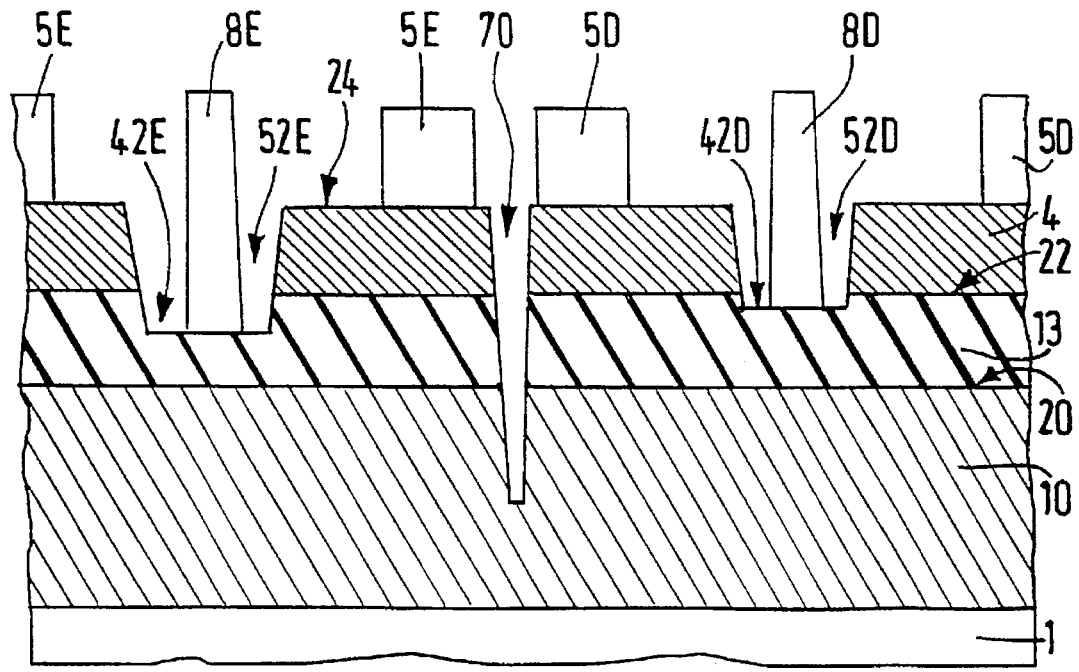
FIG. 1B shows these two transistors and their various elements.

With reference to FIG. 1B, a better operation and a better performance of the transistors of the depletion-type D and enhancement-type E are obtained when the gate contacts 8D and 8E are arranged in respective recesses 52D, 52E whose bottoms 42D, 42E are at exact distances $\Delta D$, $\Delta E$ from the interface 20 of the heterostructure. These distances $\Delta D$, $\Delta E$ represent the effective thicknesses of the active layer 13 of each type of transistor. This thickness governs the operation of the transistor which is of the enhancement type, or normally-OFF, or alternatively of the depletion type, or normally-ON, depending on this thickness.

In FIG. 1A, the enhancement-type field effect transistor E has a recess whose bottom 42E is at a distance hE of the order of 15 nm from the upper surface of the upper active layer 13, which itself is of the order of 50 nm. The total depth of the gate recess measured from the upper surface of the cap layer is HE.

Since the final thickness of the channel layer is determined by the positioning of the bottom of the gate recess relative to the position of the interface 20 of the heterostructure, it follows that in such an enhancement-type transistor a positioning error of the bottom of the gate recess of a few crystalline monolayers leads to a terrible variation in its electrical performance.

The depletion-type field effect transistor D has a recess whose bottom 42D is at a distance hD of the order of 6 nm away from the upper surface of the upper active layer 13. Accordingly, the two types of transistor E and D differ from one another only through a difference in depth of the recess of less than 10 nm. The total depth of the gate recess measured from the upper surface of the cap layer is HD.

In the method according to the invention, accordingly, steps are proposed for realising an extremely exact positioning of the bottoms 52D and 52E of the recesses which accommodate the gate contacts 8D, 8E. The advantage of the method according to the invention is that it renders possible this positioning without exceeding a permitted error of no more than a few crystalline monolayers of semiconductor material (one monolayer having a thickness of the order of 0.3 nm). Moreover, this positioning is not only exact, but also uniform over the entire surface area of the wafer under treatment, which usually has a diameter of 7.6 cm (3"), and from one wafer to the next.

In FIG. 1, the structure of the HEMTs advantageously comprises a cap layer 4. This cap layer 4 has for its first function to diminish the source and drain resistances of the transistors realised by the method according to the invention. In fact, this strongly $n^{++}$ doped layer 4 increases the conductivity of the semiconductor material in the regions situated below the ohmic source and drain contacts 5D, 5E.

This cap layer 4 also has the function of spacing the channel region apart from the regions lying below the ohmic source and drain contacts, which latter regions are mechanically and electrically disturbed during the eutectic fusion for forming the metal-semiconductor alloy which forms the ohmic contacts 5E and 5D.

The method according to the invention for realising simultaneously a gate recess with the desired accuracy in each of the transistor structures D and E will be described below with reference to FIGS. 2A to 2E.

It comprises the implementation of etching steps in the stack of layers, including the self-alignment of these etching steps on the mask openings which define the gate contacts.

According to this method, a single, conventional masking layer is thus used, for example of photoresist, and not two layers, one of dielectric material and the other of photoresist, as in the present art.

Figure 2A:
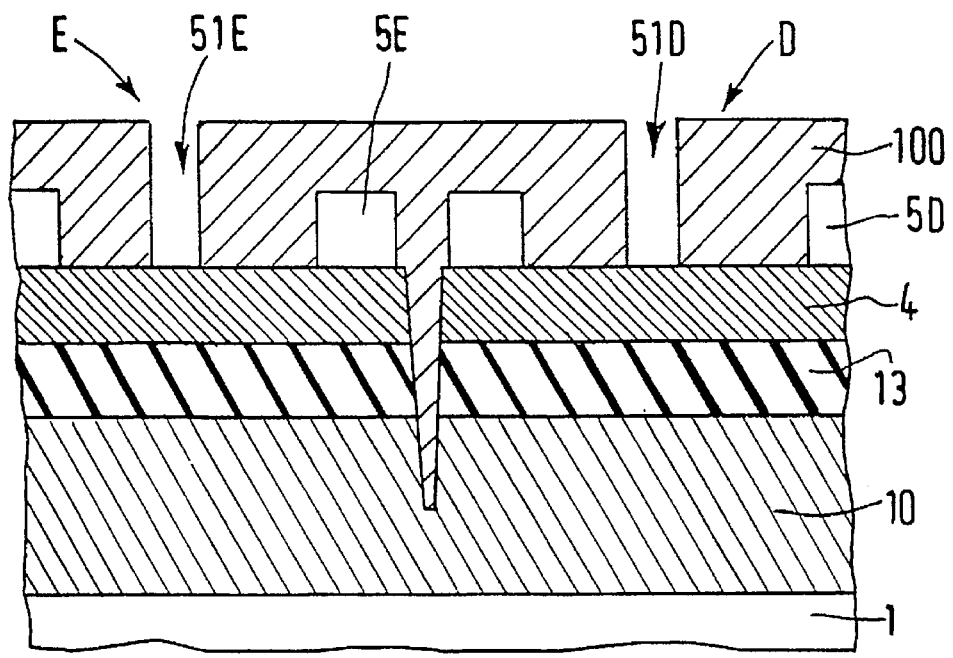
FIGS. 2A to 2E show the various steps in the method of realising the transistors of FIG. 1B.

In FIG. 2A, the process comprises the formation of the stack of layers of semiconductor materials, comprising at least:

the formation of a substrate 1 of semi-insulating gallium arsenide, growing of a layer 10 of not intentionally doped gallium arsenide, having a thickness which lies between 100 and 1000 nm, preferably 400 nm, which is the layer of small energy bandgap;

growing of a layer 13 of gallium-aluminium arsenide (GaAlAs) with an aluminum (Al) concentration of the order of 22%, strongly $n^{++}$ doped, for example with impurities such as silicon (Si) at a rate higher than or equal to $10^{18} \times cm^{-2}$, with a thickness lying between 20 and 80 nm, preferably 50 nm, which is the layer of greater energy bandgap than the subjacent layer 10.

These layers may be realised through epitaxial growth on the semi-insulating substrate.

Figure 3:
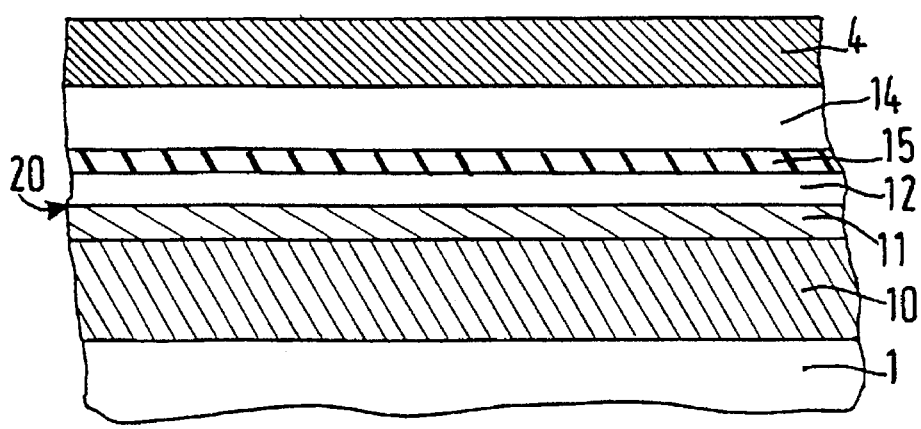
FIG. 3 shows an advantageous modification in the stack of semiconductor layers for realising pseudomorphic HEMTs.

In FIG. 3, which shows a modification, this stack of layers may comprise, starting from the substrate 1:

growing of the layer 10 of gallium arsenide (GaAs) which is not doped intentionally, called buffer layer, having the thicknesses given above for the layer also having reference numeral 10;

growing of a layer 11 of gallium-indium arsenide (GaInAs), called channel layer, having an indium concentration of the order of 22% and not intentionally doped, with a thickness lying between 0 and 30 nm, preferably 10 nm;

growing of a layer 12, called spacer layer, of gallium-aluminium arsenide (GaAlAs), having an aluminium (Al) concentration of the order of 22%, not intentionally doped, with a thickness lying between 0 and 5 nm, preferably 3 nm;

growing of a layer 15 of gallium-aluminium arsenide (GaAlAs), here called carrier supplying layer, with an aluminium (Al) concentration of the order of 22% and strongly n$^{++}$ doped at a rate higher than $10^{18} \times cm^{-2}$, with a thickness lying between 0.3 nm (one crystalline monolayer) and 40 nm, preferably 25 nm;

growing of a layer 14 of gallium-aluminium arsenide (GaAlAs), here called Schottky layer, having an aluminium (Al) concentration of the order of 22% and not intentionally doped, with a thickness of 10 to 40 nm, preferably 25 nm;

growing of the cap layer 4 of gallium arsenide (GaAs), strongly n$^{++}$ doped at a rate higher than $10^{18} \times cm^{-2}$, with a thickness lying between 5 and 100 nm, preferably 50 nm.

In this system of layers, the gallium-indium arsenide material (GaInAs) for realising the channel layer 11 has a small energy bandgap, whereas the gallium-aluminium arsenide (GaAlAs) for realising the successive, non-doped spacer layer 12, the heavily doped carrier supplying layer 15, and the Schottky layer 14 has a greater energy bandgap. Under these conditions, a bidimensional electron gas will establish itself at the interface 20 of the, spacer and channel layers 12, 11, which have different forbidden bandwidths. The HEMT having this structure is known under the designation pseudomorphic high electron mobility transistor, and at present gives a better performance than the HEMT of simpler structure described further above, because the difference between the forbidden bandwidths of the material is greater in the pseudomorphic structure.

Nevertheless, the method according to the invention may be applied to the manufacture of any transistor having a gate recess buried in the upper portion of a stack of layers which comprises at least:

an upper layer 13 or 14 on which the Schottky contact is formed in a recess, the semiconductor material having at least an aluminium content which is not zero; a non-zero content is understood to be an aluminium (Al) concentration of 0.1 in the formula of the semiconductor compound which is already sufficient for implementing the invention;

a cap layer 4 whose semiconductor material does not contain aluminium.

After the realisation of the stack of layers of semiconductor material, for example by epitaxial growth, favourably with the use of a technique known to those skilled in the art such as molecular beam epitaxy (MBE), or metal organic chemical vapour deposition (MOCVD), the manufacturing process of the transistor comprises:

realisation of the ohmic source and drain contacts 5D and 5E by any method known to those skilled in the art.

Figure 2B:
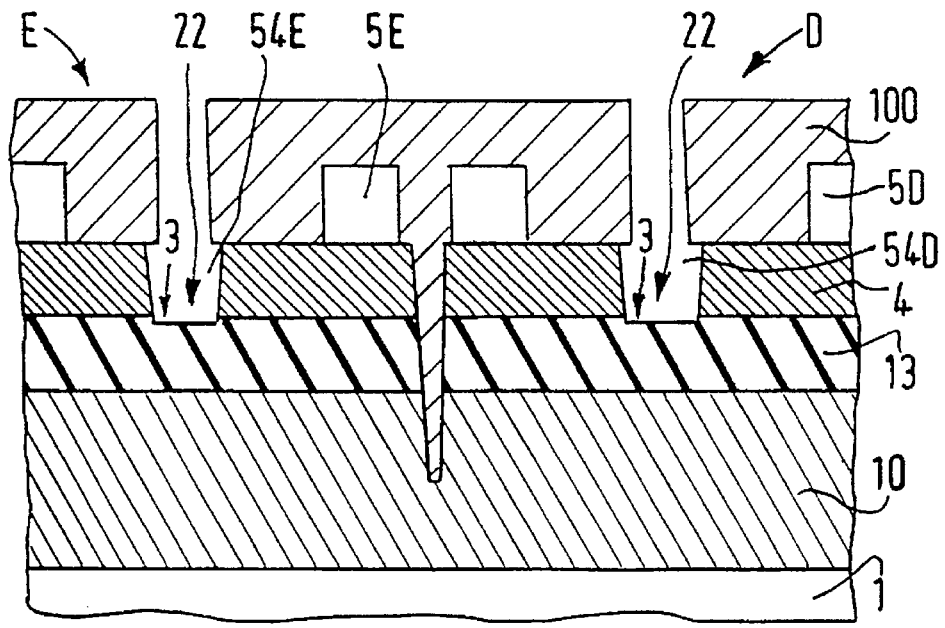

Then the method of providing the gate recesses is implemented. This method specifically comprises, according to the invention:

as shown in FIG. 2A, the formation of a mask 100 of photoresist provided with two openings 51D, 51E which may be of micron or submicron dimensions and which are favourably realised simultaneously and with the same dimensions for the two transistor types to be realised, for defining the future gate contacts 8D and 8E of these two transistors; all openings to be made subsequently in the method will be self-aligned on the respective gate openings 51D and 51E; these gate openings 51D, 51E expose the upper surface 24 of the cap layer 4. The realisation of the micron or submicron gate openings in the mask 100 is carried out by any method known to those skilled in the art, for example electron beam lithography;

as shown in FIG. 2B, simultaneous etching of respective openings 54D and 54E for the two transistors in the cap layer 4 down to the upper surface 22 of the subjacent layer 13 or 14 (depending on whether HEMTs or pseudomorphic HEMTs are realised), of semiconductor material containing the element aluminium (Al); this etching step is carried out by a reactive ion etching method (RIE) with a plasma formed by an active compound including at least fluorine (F), for example with chlorine (Cl); for example, the plasma used may favourably include $C_2Cl_2F_2$, or a mixture of $SiCl_4$ and $SF_6$; under these conditions, etching of the material of the cap layer 4, which in the present example is made of gallium arsenide (GaAs), is selective relative to the material of the subjacent layer 13 or 14, which in the present example is made of gallium-aluminium arsenide (GaAlAs).

Figure 2C:
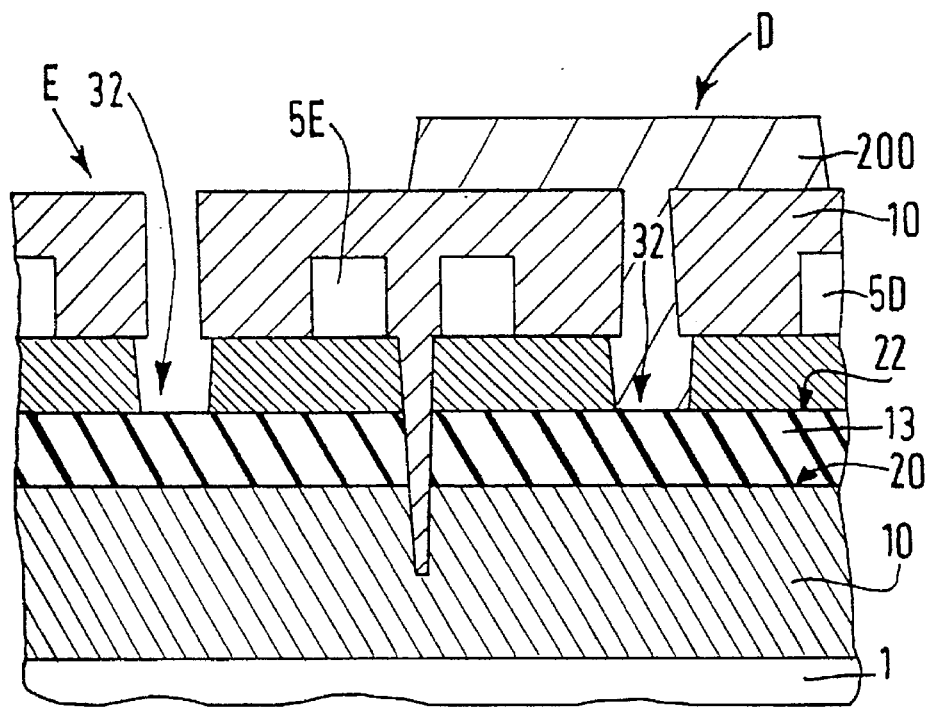
Figure 2D:
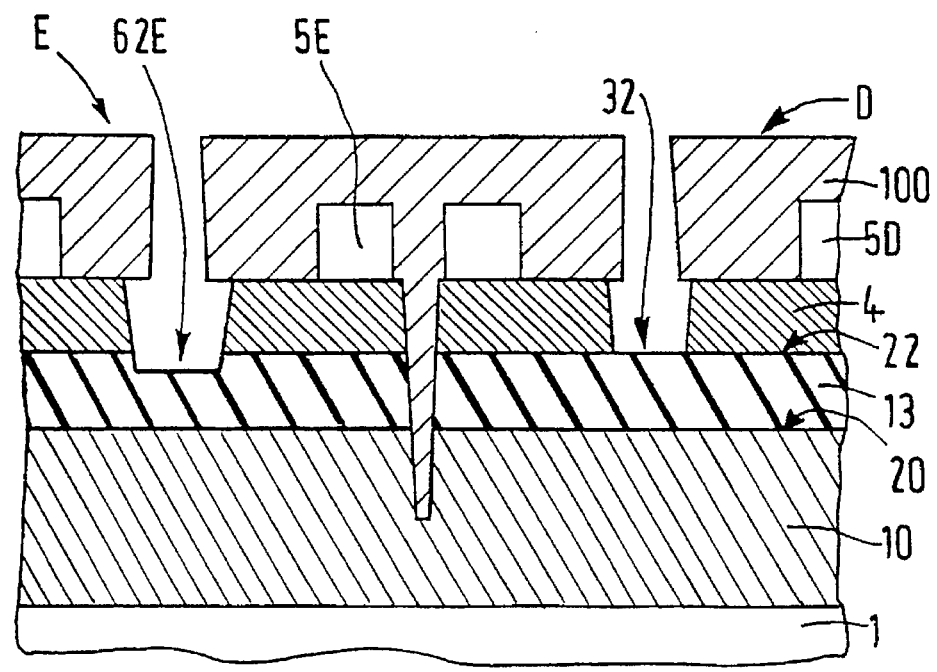

In the method according to the invention, this etching step STOPS AUTOMATICALLY at the level of the upper surface 22 of the subjacent layer 13 or 14 thanks to the SYSTEMATIC formation of a stopper layer 3 of aluminium fluoride ($AlF_3$) through reaction between the element fluorine (F) present in the etchant and the element aluminium (Al) present in the material (GaAlAs) of said subjacent layer 13 or 14; the thickness of this stopper layer of aluminium fluoride is generally one or two atomic monolayers, i.e. 0.3 to 0.6 nm, i.e. approximately 10 times thinner than the stopper layer made in the structure of the device known from the prior art.

as shown in FIG. 2C, elimination of the stopper layer 3 of aluminium fluoride ($AlF_3$), formed systematically in the preceding step, through washing in a simple immersion operation of the support wafer 1 in water; no etching agent is necessary; this results in the appearance of a surface 32 of the material of the subintent layer 13 or 14 of gallium-aluminium arsenide (GaAlAs);

Another advantage of the invention is that the stopper layer 3, whose surface coincides with that of the gate opening, is now eliminated. The completed transistor thus does not include non-eliminated portions of etching stopper layers which, if present, lead to parasitic resistances and trapping effects, or alternatively may create breakdown risks.

as shown in FIG. 2C, covering of the region of the depletion-type transistor D with a layer 200 of a photoresist material of a type different from that of the masking layer 100 previously used. The material of the layer 200 is selected from those materials which can be easily removed without deterioration of the subjacent layer 100. For example, one may choose for the material of layer 100 a PMMA photoresist; and as the material for the subsequent layer 200 a positive photoresist having an aqueous developer. Thus the layer 200 may be eliminated at any moment as desired through exposure to the light followed by development in an aqueous environment without damage to the subjacent layer 100.

as shown in FIG. 2D, the non-selective etching of the gate recess 52E for the enhancement-type transistor E through the opening 51E in the photoresist layer 100 and 54E in the cap layer 4. This etching step is carried out to a depth equal to the difference in depth HE–HD= hE–hD which must exist between the two types of transistors D and E in the given semiconductor device.

This non-selective etching step may be carried out by reactive ion etching (RIE) with a plasma containing an etchant without fluorine such as $Cl_2$ or $BCl_3$.

In an advantageous modification, this non-selective etching step may be carried out in the wet state with a mixture of $H_3PO_4$ or $H_3NO_4$, with $H_2O_2$ and $H_2O$ in the proportions 3:1:20. The advantage is that the etched surfaces obtained are clean and not damaged by the etching process.

This step carried out by either of the cited methods provides a first positioning of an intermediate level 62E in the realisation of the gate recess 52E of the enhancement-type transistor relative to the upper surface 22 of the etched layer 13 or 14. This first positioning is exact owing to the fact that this surface 22 was defined by the stopper layer 3 and now serves as a reference for the starting level for this etching of the gate recess down to said intermediate level 62E, and owing to the fact that the thickness to be etched during this step is always small: an order of magnitude for the thickness of this etching step is approximately 9 nm for obtaining the difference in depth between the recess of the depletion-type transistor D and the recess of the enhancement-type transistor E.

Those skilled in the art know how to realise such an etching step with the required accuracy of at most a few monolayers of semiconductor material because this etching starts from a surface 22 which is well defined, and because the thickness to be etched is small (less than 10 nm). In fact, the etching rate is known with an accuracy which is given by the concentration of the etchant; and the etching depth is known as a function of the etching rate during a given time. The error which may arise with such a small etched depth is thus very small itself. On the other hand, the error which may arise in the etched thickness from one end to the other of the support wafer is small because the starting reference for etching is the same over the entire wafer. The etching is accordingly uniform.

Figure 2E:
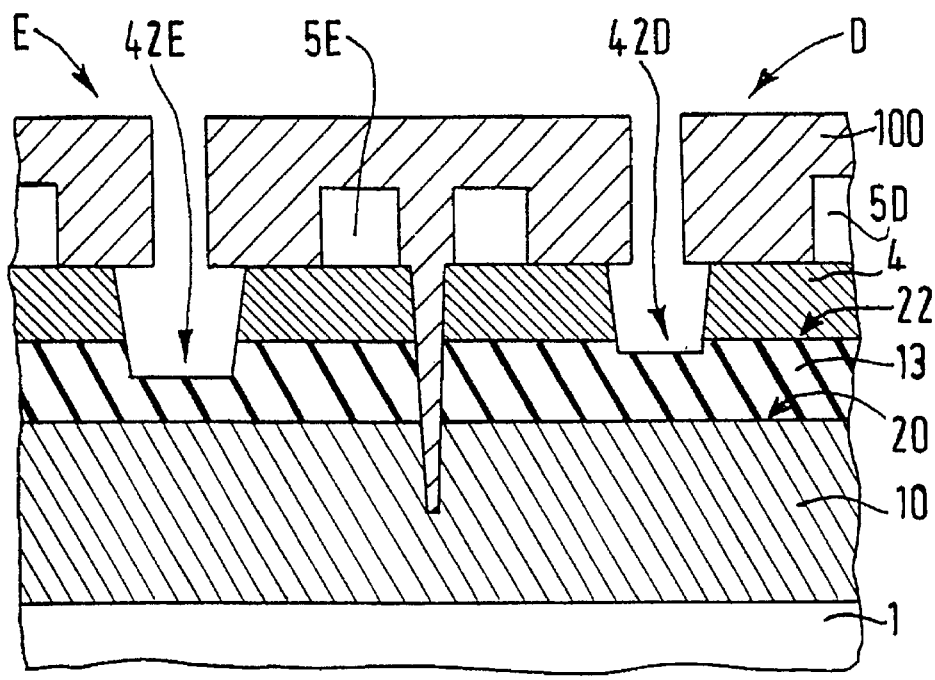

- as shown in FIG. 2D, removal of the covering material 200, which had been deposited in the step shown in FIG. 2D, from the regions of the depletion-type transistors D.
- as shown in FIG. 2E, non-selective etching by the same etching method used in the step of FIG. 2D (RIE) with $Cl_2$ or $BCl_3$; or wet etching with $H_3NO_4$, $H_2O_2$ and $H_2O$) simultaneously for the gate recess 52D of depletion-type transistor D and the gate recess 52E of enhancement-type transistor E, through the openings 51D and 51E in the photoresist layer 100 and 54D, 54E in the cap layer 4.

This etching step is carried out over a thickness of approximately 6 nm, which represents:

- the total depth of the gate recess of depletion-type transistor D in the active layer 13 or 14,
- the depth necessary for achieving the total depth of approximately 15 nm of the gate recess of the enhancement-type transistor E in the active layer 13 or 14,
- when this active layer 13 or 14, 15, 12 has a thickness of the order of 50 nm for the envisaged example of realising HEMTs or pseudomorphic HEMTs.

During this etching step, the bottom 42D of the gate recess 52D of the depletion-type transistor is directly localized at its final level starting from the upper surface 22 of the etched layer 13 or 14. This etching step is thus accurately carried out, as stated above, with the accuracy required of at most a few monolayers of semiconductor material because this etching step starts from the well-defined surface 22 and the etching depth is small ($\approx 6$ nm).

This etching step simultaneously defines the final position of the bottom 42E of the gate recess 52E of the enhancement-type transistor starting from the intermediate level 62E which had already been exactly defined. The positioning accuracy of the bottom 42E is the same now as that obtained for the bottom 42D of the recess 52D, because the etching steps are carried out jointly. The accuracy remains within the permitted range of a few monolayers of semiconductor material. So in spite of the formation of the gate recess of the transistor E in two steps, with a resumption of etching between the two steps, the bottom 42E of this recess is very exactly positioned because the etched depth in each of the two steps starts from a fixed reference each time: the first time the reference is the surface 32 in the recess 51 E; the second time the reference is the surface 32 in the recess 51D, while the etched depth for transistor E is the same as that for transistor D in this latter etching step because the two etching steps are carried out jointly. The accuracy obtained for the position of the bottom 42D of the recess of transistor D carries with it the same accuracy for the position of the bottom 42E of transistor E.

It has been found with the use of the method according to the invention that the accuracy of the total number (several thousands) of transistors of the two types realised on the same wafer is very homogeneous within the envisaged range of accuracy. Electrical tests may be carried out during the etching process for verifying parameters which are functions of the etched depth.

If the etching of the recesses 52D, 52E was carried out by RIE, a wet etching treatment may be provided, if so desired, for eliminating stresses and defects produced altering this dry etching step through a very small number of monolayers by means of a mixture of $H_3PO_4$ or $H_3NO_4$ with $H_2O_2$ and $H_2O$ in the proportions 3:1:20. Alternatively, said stresses may be removed by a heat treatment.

- as shown in FIG. 1B, the deposition of a metal layer 8E, 8D; this deposition is carried out through the gate openings 51D, 51E for realising the metal gate pads 8D, 8E with the accuracy of said gate openings 51D, 51E and in contact with the bottoms 42D, 42E of the gate recesses; this deposition is also carried out on the surface of the photoresist layer 100; this photoresist layer 100 is subsequently eliminated by a lifting-off process, which also carries along the portion of the metal layer not necessary for the gate pads 8D, 8E.

We claim:

1. A method of manufacturing a semiconductor device comprising at least two field effect transistors (D, E) with different pinch-off voltages of the buried channel type of which the first (D) has a gate recess which is less deep than that of the other (E), which method comprises:

the realization of a stack of layers on a substrate (1), among which at least:
   an active layer (13, 14) of a semiconductor compound having a non-zero aluminium (Al) content, in which a gate recess (52D, 52E) is provided,
   a cap layer (4) of a semiconductor compound without aluminium (Al) is also provides
   a masking layer (100) provided with a gate opening (51D, 51E) for each transistor (D, E) is also provided,
   a first selective etching step with a first etching compound comprising fluorine (F) carried out through the cap layer (4) and through the gate openings (51D, 51E) of the two transistors until a stopper layer (3) of aluminium fluoride ($AlF_3$) is formed at the upper surface (22) of the active layer (13, 14), after which said stopper layer (3) is eliminated, and the first transistor (D) is covered with a material (200) which can be eliminated without deterioration of the masking layer (100) previously deposited, a second non-selective etching step carried out in the active layer (13, 14) through the gate opening (51E) down to an intermediate level (62E) of the gate recess of the second transistor (E), to a depth equal to the difference in depth between the gate recesses (52D, 52E) of the two transistors, followed by removal of the covering material (200), a third non-selective etching process carried out in the active layer (13, 14) simultaneously through the two gate openings (51D, 51E) of the two transistors (D, E) down to the bottom level of the gate recess of the first transistor (D).

2. The method as claimed in claim 1, characterized in that the first selective etching step is carried out by reactive ion etching (RIE) by means of a plasma comprising a fluorine compound.

3. The method as claimed in claim 1, characterized in that the second and the third non-selective etching steps are carried out by reactive ion etching (RIE) by means of a plasma comprising a compound without fluorine.

4. The method as claimed in claim 3, characterized in that the method comprises a final treatment after the etching steps for eliminating surface stresses and defects from the surfaces etched by RIE by means of a mixture of $H_3PO_4$ or $H_3NO_4$ with $H_2O_2$ and $H_2O$ in the proportions 3:1:20.

5. The method as claimed in claim 1, characterized in that the second and the third non-selective etching steps are carried out in a wet process with an etching compound without fluorine.

6. The method as claimed in claim 1, characterized in that:
the removal of the stopper layer (3) of aluminium fluoride is carried out, through washing with water ($H_2O$).

7. The method as claimed in claim 1, characterized in that, for forming a high electron mobility field effect transistor (HEMT), the stack of semiconductor layers starting from the substrate (1) comprises at least, in the following order:

a first active layer (10) of a semiconductor compound of small energy bandgap, a second active layer (13) of a semiconductor compound having a non-zero aluminium content, of a greater energy bandgap, and heavily doped for forming a heterostructure interface (20) with the first layer (10), and in which the gate recesses (52D, 52E) are formed for accommodating Schottky gate contacts (8D, 8E), the distance between the bottoms (42D, 42E) of these recesses and the interface (20) of the heterostructure being used to control the pinch-off voltages of said two transistors having different pinch-off voltages, said two transistors being a depletion mode transistor and an enhancement-mode transistor, a heavily doped cap layer (4) for accommodating the respective ohmic contacts (5D, 5E) for the transistors (D, E).

8. The method as claimed in claim 1, characterized in that, for forming a pseudomorphic high electron mobility field effect transistor (pseudomorphic HEMT), the stack of semiconductor layers starting from the substrate comprises:

a buffer layer (10) which is not intentionally doped and is made of a semiconductor compound of small energy bandgap, a channel layer (11) which is not intentionally doped and is made of a semiconductor compound of small energy bandgap, a spacer layer (12) which is not intentionally doped and is made of a semiconductor compound of high energy bandgap, forming a heterostructure with the subjacent layer of small energy bandgap, a carrier supplying layer (15) which is heavily doped and is made of a semiconductor compound of high energy bandgap, a Schottky layer (14) which is not intentionally doped and has a non-zero aluminium content, of high energy bandgap, in which the gate recesses (52D, 52E) are formed for accommodating Schottky gate contacts (8D, 8E), the distance between the bottoms (42D, 42E) of said recesses and the interface (20) of the heterostructure being used to control the pinch-off voltages of said two transistors having different pinch-off voltages, said two transistors being a depletion mode transistor (D) and an enhancement-mode transistor (E), a heavily doped cap layer (4) for accommodating the ohmic source and drain contacts (5D, 5E) of the transistors (D, E).

9. The method as claimed in claim 7, characterized in that the semiconductor compound of small energy bandgap is gallium arsenide (GaAs) or gallium-indium arsenide (GaInAs), the semiconductor compound of high energy bandgap is gallium-aluminium arsenide (GaAlAs), and the substrate and the cap layer are made of gallium arsenide (GaAs).

10. The method as claimed in claim 8, characterized in that the semiconductor compound of small energy bandgap is gallium arsenide (GaAs) or gallium-indium arsenide (GaInAs), the semiconductor compound of high energy bandgap is gallium-aluminum arsenide (GaAlAs), and the substrate and the cap layer are made of gallium arsenide (GaAs).

11. The method of claim 2, wherein said plasma comprising a fluorine contains compounds from the group consisting of: $C_2Cl_2F_2$ and a mixture of $SiCl_4$ and $SF_6$.

12. The method of claim 3, wherein said plasma comprising a compound without fluorine contains compounds from the group consisting of: $Cl_2$ and $BCl_3$.

13. The method of claim 5, wherein said wet process with an etching compound without fluorine contains a mixture of $H_3PO_4$ or $H_3NO_4$ with $H_2O_2$ and $H_2O$ in respective portions of 3:1:20.

* * * * *